United States Patent
Li et al.

(10) Patent No.: US 7,816,927 B2
(45) Date of Patent: Oct. 19, 2010

(54) METHOD AND SYSTEM FOR REAL TIME IDENTIFICATION OF VOLTAGE STABILITY VIA IDENTIFICATION OF WEAKEST LINES AND BUSES CONTRIBUTING TO POWER SYSTEM COLLAPSE

(75) Inventors: Wenyuan Li, Burnaby (CA); Paul Choudhury, Coquitlam (CA); Jun Sun, Burnaby (CA); Juan Yu, Chongqing (CN); Yang Wang, Chongqing (CN)

(73) Assignee: British Columbia Hydro and Power Authority, Vancouver (CA)

( * ) Notice: Subject to any disclaimer, the term of this patent is extended or adjusted under 35 U.S.C. 154(b) by 300 days.

(21) Appl. No.: 11/904,153

(22) Filed: Sep. 25, 2007

(65) Prior Publication Data
US 2009/0027067 A1    Jan. 29, 2009

Related U.S. Application Data

(60) Provisional application No. 60/952,494, filed on Jul. 27, 2007.

(30) Foreign Application Priority Data
Sep. 19, 2007   (CA) ................................... 2602980

(51) Int. Cl.
    *G01R 27/28* (2006.01)
    *G01R 25/00* (2006.01)
(52) U.S. Cl. .......................... 324/650; 702/65
(58) Field of Classification Search ................. 324/650, 324/649, 600; 702/65, 64, 57, 1
See application file for complete search history.

(56) References Cited

U.S. PATENT DOCUMENTS

| | | | | |
|---|---|---|---|---|
| 4,455,612 | A * | 6/1984 | Girgis et al. | 700/294 |
| 4,584,523 | A * | 4/1986 | Elabd | 324/96 |
| 5,610,834 | A * | 3/1997 | Schlueter | 700/293 |
| 5,745,368 | A * | 4/1998 | Ejebe et al. | 702/164 |
| 6,713,998 | B2 | 3/2004 | Stanimirov et al. | |
| 6,904,372 | B2 * | 6/2005 | Fulczyk et al. | 702/58 |
| 6,933,714 | B2 | 8/2005 | Fasshauer et al. | |
| 7,096,175 | B2 * | 8/2006 | Rehtanz et al. | 703/18 |
| 7,117,070 | B2 * | 10/2006 | Chow et al. | 700/297 |
| 7,164,275 | B2 | 1/2007 | Gasperi | |

(Continued)

FOREIGN PATENT DOCUMENTS

JP           06113465 A  *  4/1994

OTHER PUBLICATIONS

Eastern Interconnection Phasor Project, IEEE, 2006, pp. 336-342.

(Continued)

*Primary Examiner*—Hoai-An D Nguyen
(74) *Attorney, Agent, or Firm*—Nixon Peabody LLP

(57) ABSTRACT

A method of identifying voltage instability in a power system via identification of a weakest line and bus that contribute to the collapse of the system is provided. The method includes periodically calculating an extended line stability index for the transmission lines monitored in the power system; and using the extended line stability index to determine the distance of an operation state in the power system from a collapse point of the system caused by voltage instability.

18 Claims, 8 Drawing Sheets

U.S. PATENT DOCUMENTS 7,248,977 B2  7/2007  Hart
7,710,729 B2  5/2010  Li et al.

OTHER PUBLICATIONS

Hong, Young-Huei. et al., Fast calculation of a voltage stability index of power systems, IEEE Transactions on Power Systems, vol. 12, No. 4, Nov. 1997, pp. 1555-1560.

Kessell, P. et al., Estimating the voltage stability of a power system, IEEE Transactions on Power Delivery, vol. PWRD-1, No. 3, Jul. 1986, pp. 346-354.

Moghavvemi, Mahmoud et al., New method for indicating voltage stability condition in power system, Supplied by the British Library, pp. 223-227.

Moghavvemi, Mahmoud et al., Power system security and voltage collapse: a line outage based indicator for prediction, Electrical Power and Energy Systems 21, 1999, pp. 455-461.

Phadke, A.G., Synchronized phasor measurements in power systems, IEEE Computer Applications in Power, Apr. 1993, pp. 10-15.

Smon, Ivan et al., Local voltage-stability index using Tellegen's Theorem, IEEE Transactions on Power Systems, vol. 21, No. 3, Aug. 2006, pp. 1267-1275.

Venkatesh, B. et al., Optimal reconfiguration of radial distribution systems to maximize loadability, IEEE Transactions on Power Systems, vol. 19, No. 1, Feb. 2004, pp. 260-266.

Vu, Khoi et al., Use of local measurements to estimate voltage-stability margin, IEEE Transactions on Power Systems, vol. 14, No. 3, Aug. 1999, pp. 1029-1035.

Xie, Xiaorong et al., WAMS applications in Chinese power systems, IEEE Power & Energy Magazine, Jan./Feb. 2006, pp. 54-63.

Zima, Marek et al., Design aspects for wide-area monitoring and control systems, Proceedings of the IEEE, vol. 93, No. 5, May 2005, pp. 980-996.

\* cited by examiner

METHOD AND SYSTEM FOR REAL TIME IDENTIFICATION OF VOLTAGE STABILITY VIA IDENTIFICATION OF WEAKEST LINES AND BUSES CONTRIBUTING TO POWER SYSTEM COLLAPSE

CROSS-REFERENCE TO RELATED PATENT APPLICATION OR PRIORITY CLAIM

This application claims the benefit of U.S. Provisional Patent Application No. 60/952,494, filed Jul. 27, 2007, and Canadian Patent Application No. 2,602,980, filed on Sep. 19, 2007, which are incorporated herein by reference.

FIELD OF THE INVENTION

This invention relates to methods of preventing voltage collapse of power systems in electric utilities, and more particularly to methods of real time monitoring of voltage stability at such utilities.

BACKGROUND OF THE INVENTION

The problem of voltage instability has been a major concern of electric utilities for a long time. This problem has drawn great interest as voltage instability-related outage events occur around the world and result in blackouts. Although considerable efforts have been devoted to voltage stability assessment methods, most are only usable in off-line applications.

The most popular method of assessing voltage stability is the use of continuation power flow to identify the collapse point where the system power flow diverges, as disclosed in "Assessment of Voltage Security Methods and Tools", EPRI report TR-105214, 1995; and Taylor C W, "Power system voltage stability [M]," McGraw-Hill, Inc., New York, America, 1994. This method is widely employed in the industry, and serves as a reference to new methods. Disadvantages of the continuation power flow method include:

- Considerable system-wide power flow calculations making the method difficult to implement in a real time application;
- Impossible to accurately handle actual time-dependent load characteristics (voltage- and frequency-related loads);
- Possible premature divergence in system continuation power flows;
- Inaccurate line parameters (resistance and reactance of lines), which are assumed to be constant in any environment or weather condition;
- Inconsistency between off-line model and real life situation; and
- Incapability to identify weak lines and buses that cause system collapse.

Various voltage stability indices have been proposed for voltage instability. The indices may be divided into two types: system-wide indices and localized indices. The system-wide indices are based on system power flow calculations (as disclosed in Young Huei Hong, Ching Tsai Pan, and Wen Wei Lin, "Fast calculation of a voltage stability index of power systems [J]," IEEE Trans. on Power Syst., vol. 12, no. 4, pp. 1555-1560, November 1997; and P Kessel, H Glavitsch, "Estimating the voltage stability of a power system [J]," IEEE Trans on Power Delivery, vol. PWRD-1, no. 3, pp. 346-354, July 1986) and thus have the same disadvantages as the continuation power flow method. The localized indices focus on individual buses (as disclosed in Ivan Šmon, Gregor Verbič, and Ferdinand Gubina, "Local voltage-stability index using Tellegen's theorem [J]," IEEE Trans. on Power Syst., vol. 21, no. 3, pp. 1267-1275, August 2006; and K. Vu, M. M. Begovic, D. Novosel and M. M. Saha, "Use of local measurements to estimate voltage stability margin," IEEE Trans. Power Systems, Vol. 14, No. 3, pp. 1029-1035, August 1999) or lines (as disclosed in M. Moghavvemi and M. O. Faruque, "Power system security and voltage collapse: a line outage based indicator for prediction [J]," Electrical Power and Energy Systems, Vol. 21, pp. 455-461, 1999; B. Venkatesh, R. Ranjan, and H. B. Gooi, "Optimal reconfiguration of radial distribution systems to maximize loadability [J]," IEEE Trans. on Power Syst., vol. 19, no. 1, pp. 260-266, February 2004; and M. Moghavvemi "New method for indicating voltage stability condition in power system [C]," Proceeding of IEE International Power Engineering Conference, IPEC 97, Singapore, pp. 223-227), and generally do not require continuation power flow calculations and are relatively easy for use in the on-line environment. However, problems of prior art localized indices include inaccuracy in theoretical derivation and calculations; and incapability to filter invalid measurements. The indices Lp and Lq, given in the Moghavvemi references above, cannot reach the expected value at the system collapse point even in the results of the authors' example. In fact, studies found that these two indices are based on an implied assumption of the line impedance factor being equal to the power factor, which is not true in most cases. The index presented in the Venkatesh reference targets a radial distribution line with an assumption of constant voltage at the sending bus, which is not true in looped transmission systems. Also, its denominator can be mathematically zero in which case the index becomes meaningless. Particularly, all the existing line indices do not consider impacts of the whole system beyond the line so they do not provide accurate and correct information in actual applications.

The localized index disclosed in the Šmon and Vu references, and in the U.S. Pat. No. 6,219,591 and U.S. Pat. No. 6,690,175 is based on the Thevenin theorem and conceptually can be used in real time applications. Unfortunately, such index and method have the following concerns and disadvantages:

- The calculation of the index requires measurements of voltages and currents in at least two system states and is based on the assumption that the equivalent Thevenin voltage and impedance are constant in the two system states. If the two system states are far apart, this assumption is invalid whereas if they are too close, it may result in a large calculation error for the estimate of equivalent Thevenin impedance. This assumption therefore, causes inaccuracy and difficulties in the actual implementation.
- The method has no way to identify any wrong or invalid measurement. If any measurement of voltages or currents is incorrect or has a relatively large error, which can happen in any real measurement system, the index becomes useless.
- The index cannot identify the weak lines that cause system collapse.
- The method cannot be implemented using the existing SCADA (Supervisory Control And Data Acquisition) measurements and EMS (Energy Management Systems), which are available at utility control centers.

U.S. Pat. No. 6,232,167 discloses a method to identify weak lines (branches) only. U.S. Pat. No. 6,904,372 disclose a method to identify weak buses only. Neither of these methods is designed for identification of system instability. U.S. Pat. No. 5,610,834 discloses a method to improve voltage stability using a P-V curve approach, and U.S. Pat. No. 5,745, 368 discloses a method to reduce computing efforts in calculating the voltage collapse point on a P-V or Q-V curve. Such methods are based on off-line system power flow calculations and cannot be used in a real time environment. U.S. Pat. No. 7,096,175 discloses a technique to predict system stability by using phasor measurements and conducting a fast system power flow calculation after a contingency. However, the time-varying characteristics of line parameters (resistance and reactance) are not considered. Also, the method cannot be used to identify weakest lines or buses that cause system instability as its criterion is based on the divergence of power flow calculations of whole system.

SUMMARY OF THE INVENTION

The method and system according to the invention provide a new localized voltage stability index, referred to herein as Extended Line Stability Index (ELSI), the method of calculating the ESLI, and implementation aspects in a real time environment. Some features of the method and system according to the invention include:

- Simultaneous and real time identification of system instability as well as weakest lines (branches) and buses causing system collapse;
- No system-wide power flow calculations are required (the system can perform very fast calculations that generally take less than 0.1-0.5 seconds);
- Real time estimation of time-varying system parameters (line resistance, reactance and grounding admittance);
- Automatic handling of actual load characteristics (voltage-related or frequency-related loads);
- Capable of filtering invalid or bad measurements;
- Less calculation errors compared to methods based on the Thevenin theorem;
- Can be used to trigger a RAS (remedial action scheme) for protecting the power system from voltage collapse; and
- Can be implemented using either Phasor Measurement Unit (PMU) information (which provides greater accuracy) or existing SCADA information and EMS environment.

A method of identifying voltage instability in a power system having a plurality of monitored transmission lines is provided, including (a) receiving periodic input regarding said plurality of transmission lines; (b) calculating an index for each of said plurality of transmission lines in said power system using said input; and (c) identifying a weakest line amongst said plurality of transmission lines, said weakest line having a lowest calculated index amongst said plurality of transmission lines.

The periodic input may be received from a plurality of phasor measurement units, the inputs including, a voltage magnitude $V_i$ at a sending bus i, a voltage magnitude $V_j$ at a receiving bus j of each transmission line i-j, a voltage angle $\theta_i$ at the sending bus and a voltage angle $\theta_j$ at the receiving bus; a line power flow $P_{ij}+jQ_{ij}$ with a charging reactive power included at the receiving bus; and a line power flow $P_i+jQ_i$ with a charging reactive power included at the sending bus. The index for each of the transmission lines between the sending bus i and the receiving bus j, may be calculated as:

$$BLSI = \frac{V_i^2}{2\left[R_{ij}P_{ij} + X_{ij}Q_{ij}^* + \sqrt{(R_{ij}^2 + X_{ij}^2)(P_{ij}^2 + (Q_{ij}^*)^2)}\right]} \geq 1$$

wherein $R_{ij}+jX_{ij}$, is a line impedance associated with the transmission line i-j, and the line impedance is calculated using the input, the input received from a plurality of phasor measurement units; $P_{ij}+jQ^*_{ij}$ is a line power flow with a charging reactive power excluded at the receiving bus j, wherein $P_{ij}$ is received from the phasor measurement units, and $Q^*_{ij}$ is calculated using the input; and $V_i$ is a voltage at the sending bus and is received from the phasor measurement units.

The index for each of the transmission lines between a sending bus i and a receiving bus j, may be calculated as:

$$ELSI = \frac{E_k^2}{2\left[R_{kj}P_{ij} + X_{kj}Q_{ij}^* + \sqrt{(R_{kj}^2 + X_{kj}^2)(P_{ij}^2 + (Q_{ij}^*)^2)}\right]} \geq 1$$

wherein $R_{kj}+jX_{kj}$ is an equivalent extended line impedance associated with the transmission line i-j, and is calculated using the input, the input received from a plurality of phasor measurement units; $P_{ij}+jQ^*_{ij}$ is a line power flow with a charging reactive power excluded at the receiving bus j, wherein $P_{ij}$ is received from the phasor measurement units and $Q^*_{ij}$ is calculated using the received input; and $E_k$ is an equivalent source voltage, and is calculated using the received input from the plurality of phasor measurement units.

If the index of at least one transmission line in the power system is equal to or less than a predetermined threshold, a remedial action scheme may be undertaken to protect the system from voltage collapse. The remedial action scheme may protect the system from voltage collapse in a normal operation state of the system or in a contingency state of the system.

The periodic input may be received from a state estimator using supervisory control and data acquisition measurements, the input including a line impedance associated with the transmission line; a voltage magnitude at a sending bus and a voltage magnitude at a receiving bus of the transmission line respectively, a voltage angle at the sending bus and a voltage angle at the receiving bus of the line; a line power flow with a charging reactive power at the receiving bus; a line reactive power flow at the receiving bus; and a line power flow with a charging reactive power at the sending bus.

A method of using synchronized measurements from phasor measurement units to calculate a plurality of indices is provided, each of the indices associated with a transmission line within a power system, for predicting voltage instability of the power system including (a) receiving periodic measurements from the phasor measurement units; (b) filtering invalid data amongst the measurements; (c) estimating parameters associated with the transmission lines; and (d) calculating the indices associated with the transmission lines. The measurements may be voltage phasors and current phasors at a sending bus and a receiving bus of each of the transmission lines; and the parameters may bee resistance, reactance and grounding admittance of each of the transmission lines.

A method of identifying voltage instability in a power system having a plurality of monitored lines, via identification of a weakest line in said system capable of contributing to the collapse of said system, is provided, including the steps of: (a) obtaining measurements associated with each of the transmission lines from a measurement source; (b) obtaining values of a plurality of parameters associated with the plurality of power lines; and (c) calculating an index for each of the plurality of lines, such that the lowest index associated with a line identifies the weakest line.

The measurement source may be a state estimator using supervisory control and data acquisition measurements.

The measurements for each of the transmission lines i-j may include: a voltage magnitude $V_i$ at a sending bus i and a voltage magnitude $V_j$ of a receiving bus j of the line i-j; and a voltage angle $\theta_i$ at the sending bus i, and a voltage angle $\theta_j$ at the receiving bus i; a line power flow $P_{ij}+jQ_{ij}$ with a charging reactive power included at the receiving bus; and a line power flow $P_i+jQ_i$ with a charging reactive power included at the sending bus.

The method may include filtering invalid measurements from the measurements obtained from the phasor measurement units; and the parameters may include resistance, reactance and admittance of each of the transmission lines, and the values of at least one of the plurality of parameters may be estimated.

A system for identifying voltage instability in a power grid is provided including: a plurality of monitored transmission lines; a computer; and a measurement source, wherein the measurement source provides measurements associated with at least some of the transmission lines to the computer, and the computer calculates an index for each of the plurality of transmission lines, such that the lowest value index associated with the lines identifies a weakest transmission line amongst the plurality of transmission lines. The measurement source may be a state estimator using supervisory control and data acquisition measurements. The measurement source may be a plurality of phasor measurement units.

DETAILED DESCRIPTION OF THE INVENTION

Note that in this document, the unit of all quantities is referenced in per unit system; all quantities related to real or reactive power refer to the total power in three phases; and voltage quantities to refer to the line voltage.

Basic Line Voltage Stability Index

Described below is the derivation of the basic line stability index (BLSI), which demonstrates a concept behind the method according to the invention. After the derivation of the BSLI is described, the derivation of the extended line stability index (ELSI) is provided, which is used in actual applications according to the invention, and finally, implementation issues are addressed.

In any complex transmission system, if there exists at least one line (branch) on which the loading level exceeds the line's maximum transfer capability, the system will lose its voltage stability. The maximum transfer capability of a line can be determined from the criterion for a system state: if the sending bus voltage exists but there is no mathematical solution for the receiving bus voltage due to sufficiently large loading level and line impedance, this loading level reaches the maximum transfer capability of the line. In other words, if any line loses voltage stability, the whole system collapses in this state.

Figure 1:
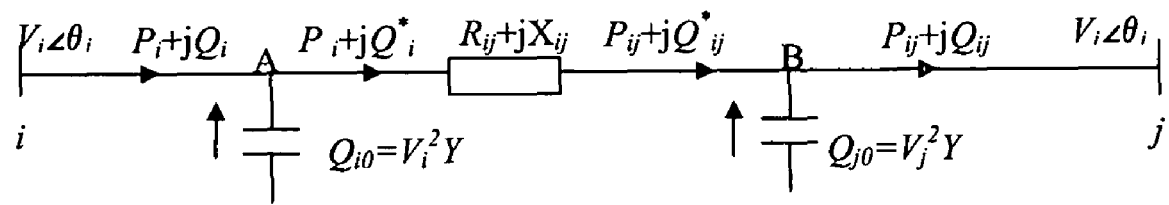
FIG. 1 is a one-line diagram of a typical transmission line i-j.

FIG. 1 shows the π-equivalent circuit of a single line (or branch) in a looped transmission system. $R_{ij}+jX_{ij}$ is the line impedance. Y represents half of the grounding admittance corresponding to charging reactive power of the line. $V_i \angle \theta_i$ and $V_j \angle \theta_j$ are the voltage phasors at the sending and receiving buses. $P_i+jQ_i$ and $P_i+jQ^*_i$ are the line power flows respectively before and after the charging reactive power at the sending bus i. $P_{ij}+jQ^*_{ij}$ and $P_{ij}+jQ_{ij}$ are the line power flows before and after the charging reactive power at the receiving bus j. $Q_{i0}$ and $Q_{j0}$ represent the charging reactive powers at the sending and receiving ends respectively. In the real application, only $P_i$, $Q_i$, $P_{ij}$ and $Q_{ij}$ are measurable through PMUs whereas $Q^*_i$ and $Q^*_{ij}$ can be calculated using $Q_i$ and $Q_{ij}$ and the charging reactive power. The charging reactive power occurs along the line but the total charging reactive power can be calculated by the difference between $Q_i$ and $Q_{ij}$ minus the reactive losses on the line. In the following derivation of BLSI, the line flows of $P_i+jQ^*_i$ and $P_{ij}+jQ^*_{ij}$ between the nodes A and B are used to develop the concise relationship between voltage stability and the parameters and loading of the lines. The use of measurable $Q_i$ and $Q_{ij}$ to obtain $Q^*_i$ and $Q^*_{ij}$ is described below in respect of the implementation of real-time voltage instability identification.

The line (branch) power flow equation of $P_{ij}+jQ^*_{ij}$ can be expressed as:

$$P_{ij} + jQ^*_{ij} = V_j \angle \theta_j \left( \frac{V_i \angle \theta_i - V_j \angle \theta_j}{R_{ij} + jX_{ij}} \right)^{\oplus} \tag{1}$$

wherein the symbol $\oplus$ denotes the conjugate operation. Separating Equation (1) into the real and imaginary parts yields:

$$R_{ij}P_{ij}+X_{ij}Q^*_{ij}=-V_j^2+V_iV_j \cos \theta_{ji} \tag{2}$$

$$R_{ij}Q^*_{ij}-X_{ij}P_{ij}=V_iV_j \sin \theta_{ji} \tag{3}$$

wherein $\theta_{ji}=\theta_j-\theta_i$.

By eliminating the angle difference $\theta_{ji}$ from Equations (2) and (3), the following double quadratic equation with $V_j^2$ as an unknown variable is obtained:

$$V_j^4 + 2\left(R_{ij}P_{ij} + X_{ij}Q^*_{ij} - \frac{V_i^2}{2}\right)V_j^2 + (R_{ij}^2 + X_{ij}^2)(P_{ij}^2 + (Q^*_{ij})^2) = 0 \tag{4}$$

When the discriminant of Equation (4) is greater than or equal to 0, that is, $$\left[R_{ij}P_{ij} + X_{ij}Q_{ij}^* - \frac{V_i^2}{2}\right]^2 - (R_{ij}^2 + X_{ij}^2)(P_{ij}^2 + (Q_{ij}^*)^2) \geq 0 \quad (5)$$

then Equation (4) has the following two solutions:

$$V_j^2 = -\left[R_{ij}P_{ij} + X_{ij}Q_{ij}^* - \frac{V_i^2}{2}\right] \pm \sqrt{\left[R_{ij}P_{ij} + X_{ij}Q_{ij}^* - \frac{V_i^2}{2}\right]^2 - (R_{ij}^2 + X_{ij}^2)(P_{ij}^2 + (Q_{ij}^*)^2)} \quad (6)$$

As $(R_{ij}^2 + X_{ij}^2)(P_{ij}^2 + (Q^*_{ij})^2) \geq 0$, it follows that:

$$\sqrt{\left[R_{ij}P_{ij} + X_{ij}Q_{ij}^* - \frac{V_i^2}{2}\right]^2 - (R_{ij}^2 + X_{ij}^2)(P_{ij}^2 + (Q_{ij}^*)^2)} \leq \left|R_{ij}P_{ij} + X_{ij}Q_{ij}^* - \frac{V_i^2}{2}\right|$$

So that $V_j$ can have two positive real number solutions from Equation (6), the following Equation (7) must hold:

$$R_{ij}P_{ij} + X_{ij}Q_{ij}^* - \frac{V_i^2}{2} \leq 0 \quad (7)$$

Therefore, Equation (5) can be re-written as:

$$BLSI = \frac{V_i^2}{2\left[R_{ij}P_{ij} + X_{ij}Q_{ij}^* + \sqrt{(R_{ij}^2 + X_{ij}^2)(P_{ij}^2 + (Q_{ij}^*)^2)}\right]} \geq 1 \quad (8)$$

The BLSI index in Equation (8) has the following implications:

The BLSI must be larger than or equal to 1.0 so that the receiving bus voltage $V_j$ has a mathematical solution that is operational in real life.

When the BLSI is equal to 1.0, the two positive number solutions of Equation (6) become the same, meaning that the PV curve nose point or the maximum loadability of the line (branch) is reached.

The BLSI can be used to identify weak lines (branches) and buses (receiving bus of weak lines) in a system. The closer to 1.0 the BLSI of a line, the weaker the line. It can also be used to predict voltage instability of a system state, since as long as the BLSI of at least one line in the system is sufficiently close to 1.0, the system reaches its collapse point.

When the BLSI is larger than 1.0, the maximum loadability of the line can be approximately estimated by BLSI*$S_{ij}$ where $S_{ij}=\sqrt{P_{ij}^2+Q_{ij}^2}$, therefore (BLSI-1)*$S_{ij}$ represents the line loading margin in the current system state. The estimate of the line maximum loadability is accurate only when BLSI=1.0 whereas it is approximate when BLSI>1.0. This is because $V_i$ is different for the system states when BLSI=1.0 and BLSI>1.0. The closer to 1.0 the index BLSI is, the more accurate the estimate is of line maximum loadability. The approximate estimate is still useful and meaningful as when the BLSI is much larger than 1.0, the system is secure and a relatively larger error in the estimate is not important. When the BLSI approaches 1.0, the system moves towards the collapse point and the estimate becomes more accurate.

Extended Line Voltage Stability Index

Above has been provided the derivation and use of the line voltage stability index. However, the BSLI index is not accurate enough for identification of system voltage instability, although it can identify weak lines (branches) and buses in the system. This is because the BSLI only considers individual lines, but misses the impact of the rest of the power system on the line voltage and line power flow. In other words, the line power flow has to traverse external impedance before it reaches the sending bus of the line and subsequently transfers over the line. Following is disclosed a method to derive the extended line stability index (ELSI) that is based on the BSLI but include both impacts of the line itself and the system outside the line.

Figure 2:
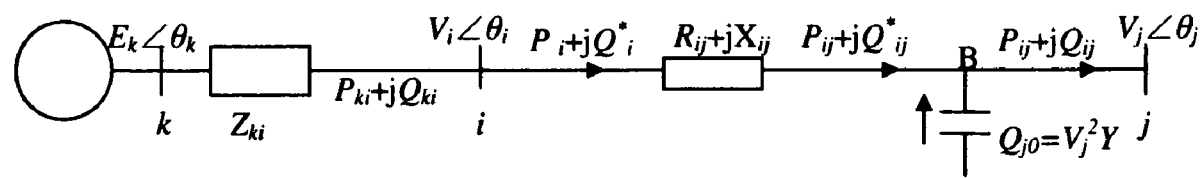
FIG. 2 is an equivalent representation of a transmission line i-j and the system outside the line i-j.

As shown in FIG. 2, the system outside the line i-j can be represented using an equivalent source voltage $E_k \angle \theta_k$ and impedance $Z_{ki}$. This means that as long as the equivalent $E_k \angle \theta_k$ and $Z_{ki}$ can be determined to produce the fully identical bus voltages (magnitude and angle) at the two buses i and j, and power flows (real and reactive flows) of the line i-j that the system outside the line i-j imposes on the line, the equivalent $E_k \angle \theta_k$ and $Z_{ki}$ have the same effect on the line as does the external system outside line, (i.e., the network outside the sending bus i and the receiving bus j). Note that the grounding branch of reactive charging power at the sending bus is merged as part of the equivalent impedance $Z_{ki}$. The $Z_{ki}$ represents the impedance that the power flow on the line i-j encountered, before it arrives at the sending bus and is generally smaller than the line impedance as it is an equivalence of the external system, which contains many looped and parallel branches.

Letting $Z_{ij}=R_{ij}+jX_{ij}$ it follows:

$$P_{ki} - jQ_{ki} = \quad (9)$$
$$P_i - jQ_i^* = (V_i \angle -\theta_i) \cdot \left(\frac{E_k \angle \theta_k - V_i \angle \theta_i}{Z_{ki}}\right) = (V_i \angle -\theta_i) \cdot \left(\frac{V_i \angle \theta_i - V_j \angle \theta_j}{Z_{ij}}\right)$$

Therefore, $$\frac{E_k \angle \theta_{ki} - V_i}{Z_{ki}} = \frac{V_i - V_j \angle \theta_{ji}}{Z_{ij}} \quad (10)$$

wherein $\theta_{ki}=\theta_k-\theta_i$ and $\theta_{ji}=\theta_j-\theta_i$.

Therefore:

$$\frac{Z_{ki}}{Z_{ij}} = \frac{E_k \angle \theta_{ki} - V_i}{V_i - V_j \angle \theta_{ji}} \quad (11)$$

Equation (11) can be re-written as:

$$K = \frac{Z_{ki} + Z_{ij}}{Z_{ij}} = \frac{Z_{ki}}{Z_{ij}} = \frac{E_k \angle \theta_{ki} - V_j \angle \theta_{ji}}{V_i - V_j \angle \theta_{ji}} \quad (12)$$

Equivalently:

$$E_k \angle \theta_{ki} = V_j \angle \theta_{ji} + K \cdot (V_i - V_j \angle \theta_{ji}) \quad (13)$$

Assuming that two power flow states are available and are expressed by the subscripts 1 and 2 respectively, it follows:

$$E_k \angle \theta_{ki} = V_{j1} \angle \theta_{ji1} + K \cdot (V_{i1} - V_{j1} \angle \theta_{ji1}) \quad (14)$$

$$E_k \angle \theta_{ki} = V_{j2} \angle \theta_{ji2} + K \cdot (V_{i2} - V_{j2} \angle \theta_{ji2}) \quad (15)$$

Solving Equations (14) and (15) yields:

$$K = \frac{V_{j1} \angle \theta_{ji1} - V_{j2} \angle \theta_{ji2}}{(V_{j1} \angle \theta_{ji1} - V_{j2} \angle \theta_{ji2}) - (V_{i1} - V_{i2})} \quad (16)$$

Once K is obtained, $E_k \angle \theta_{ki}$ and $Z_{ki}$ can be calculated from Equations (13) and (12).

In the extended line between the buses k and j, the section between buses i and j is the actual line i-j, whereas the section between buses k and i represents the effect of the external system outside the line i-j in such a way that the power flow on line i-j is produced from the equivalent source at the bus voltage $E_k$ and must go through the equivalent impedance of $Z_{ki}$ first, before arriving at the sending bus i of the actual line, and then flowing on the line with the impedance of $Z_{ij}$ and reaching the receiving bus j. The equivalent source voltage and impedance create the same bus voltages and power flows of the line as the whole system. Therefore, similar to the derivation of the BSLI described above, the line voltage stability index for the maximum transfer capability of the extended line, including the external system effect, can be calculated using Equation (8) if $V_i$ and $R_{ij}+jX_{ij}$ are replaced by $E_k$ and $Z_{kj}=R_{kj}+jX_{kj}$. Therefore, the ESLI for the extended line is calculated as:

$$ELSI = \frac{E_k^2}{2\left[R_{kj}P_{ij} + X_{kj}Q_{ij}^+ + \sqrt{(R_{kj}^2 + X_{kj}^2)(P_{ij}^2 + (Q_{ij}^+)^2)}\right]} \geq 1 \quad (17)$$

Note the following:
To identify system instability and weakest lines (branches) and buses, the index ESLI rather than the BSLI should be used, as the index ESLI includes the effects of both the line itself and the external system outside the line, which is accurate, whereas the BSLI only reflects the effect of the line itself and is not sufficiently accurate.

The BSLI is also useful for identifying weak lines (branches) and buses in a relative sense and providing the information about the maximum transfer capability of the line itself.

The index ESLI can be used for any line including those without load at its receiving bus (such as tie lines or other branches with a heavy loading level, which may often have a voltage instability problem). The weakest line/bus in a system causes system instability.

The equivalent source voltage and impedance in the derivation of the extended index are completely different from the equivalent source voltage and impedance used in the Thevenin theorem. There is no concept of Thevenin load in the method according to the invention. Note that unlike the Thevenin load, the line impedance does not return to another end of the equivalent voltage source. Also, the angle $\theta_{ki}=\theta_k-\theta_i$ in the equivalent voltage source $E_k \angle \theta_{ki}$ is the difference between voltage angles at two buses but not a voltage angle at a single bus. Particularly, the equivalence impedance $Z_{ki}$ is never equal to the line impedance $Z_{ij}$ when the line reaches voltage instability.

Somewhat similar to (but different from) the bus index method that is based on the Thevenin theorem, the two system states are needed to calculate the equivalent source voltage $E_k$ and impedance $Z_{ki}$. This assumption may create a small but acceptable error in calculations. It can be seen from Equations (16), (12) and (13) that the calculation error is only associated with K, and the effect of K on the estimates of $E_k$ and $Z_{ki}$ is just a small portion. In other words, the $Z_{ki}$ is just a part of the total extended line impedance $Z_{kj}$, and in most cases, $Z_{ki}$ is smaller than the impedance of actual line $Z_{ij}$, whereas $Z_{ij}$, which plays a dominant role, can be accurately estimated using the PMU information in the real time application (as disclosed below). Therefore, the calculation error due to the two system state assumption in the presented method should be much smaller than that in the Thevenin theorem based method.

As disclosed in relation to the BLSI, a loading margin for the extended line can be calculated using the ELSI, i.e., (ELSI-1)*$S_{ij}$.

Implementation of Real-Time Voltage Instability Identification

The method and index presented above can be implemented in a real time manner using synchronized PMU information or in an on-line manner using the existing SCADA and EMS at a control center of a utility.

A. Basic Tasks in Implementation Using Synchronized PMU Information

One of the advantages of the presented method is the fact that the ELSI only requires the information of voltage magnitude at the sending bus, line power flows at the receiving bus, and line parameters, all of which can be acquired in a real time manner through synchronized PMU measurements. The PMUs transmit measurements to a control center, which has a computer. The computer receives the measurements and carries out the calculations. The computer is conventional, having a memory, fixed storage, a processor, input means and output means. The PMU devices are installed at two sides of the critical lines monitored, which may include tie lines, long distance lines with a heavy loading level, long distance radial lines and other important lines. The application of PMUs is currently limited to phasor monitoring and enhancement in the state estimator function within EMS. The system according to the invention provides an application of PMU for simultaneously identifying system voltage instability with the weakest lines and buses and protecting the system from voltage collapse.

The real time implementation includes the following three basic tasks:

(1) A sampled measurement from a PMU (including any or all of voltage magnitudes, angles, real and reactive powers) may include invalid data. False data that is caused by failure or malfunction of PMU devices or communication channels may or may not be recognized using features of PMU measurements. Particularly, some errors that are only associated with accuracy of measurements cannot be identified by the PMU itself. Identifying and filtering out invalid measurements is therefore the first task that must be completed in implementation.

(2) The line (branch) parameters (resistance, reactance of lines and admittance representing reactive charging power) cannot be directly measured by PMU. These parameters vary with the environment and weather (such as temperature) conditions. Therefore it is necessary to perform a real time estimate of line parameters. The assumption of constant line parameters in the prior art is not reasonable in real time applications.

(3) Once invalid measurements are filtered out and line parameters are estimated, the most recent measurements from the PMU are used to calculate the real time ELSI of all lines monitored. The smallest ELSI provides information about how far away the current system state is from the collapse point and which line (branch) and bus are the weakest line and bus causing system instability.

In the following disclosure, the $\pi$ equivalence of a line shown in FIG. 1 is used to illustrate the implementation process. Generally, this equivalence is sufficient, although it is not difficult to extend the concept to a multiple $\pi$ equivalence circuit in the process of invalid data filtering and parameter estimation if it is necessary in the actual application.

The $V_i$, $\theta_i$, $V_j$, $\theta_j$, $P_i$, $Q_i$, $P_{ij}$ and $Q_{ij}$ are the bus voltages (magnitude and angles) and line power flows (real and reactive powers) at both sides of a line, respectively, and are directly obtained from the measurements of PMU in a real time manner. (Note that the initial measurements are voltage and current phasors but these can be easily converted to line power flows.) The estimation of line parameters of $R_{ij}$, $X_{ij}$ and Y and calculation of real time ELSI indices for all lines monitored are performed at a given time interval (such as every 2-5 minutes for parameter estimation and every 5 seconds for ELSI calculation). PMU devices can create synchronized phasor data at a rate of 10-30 samples per second or faster, and therefore there are considerable sampling data available in a given interval. Note that the rate of waveform sampling can be up to 3000 or more samples per second. The parameters of $R_{ij}$, $X_{ij}$ and Y may vary with the environment and weather conditions around the line in a relatively long period (such as more than half an hour). However, unlike the measurements of voltages and line (branch) power flows, the parameters are sufficiently stable (constant or minor fluctuations) in a short interval (for example, a couple of minutes). The effect of parameter estimation is twofold. The parameters should be re-estimated at a given interval in a real time manner whereas their stability in a very short time is utilized to filter invalid measurements.

B. Filtering Invalid Measurements

A number of sets of sampling data (measurements) are taken in the given interval. For each set of measurements, the following data filtering process is performed:
1. The $R_{ij}$, $X_{ij}$ and Y from the last estimation are used as a reference.
2. The charging reactive powers are calculated by:

$$Q_{i0}=V_i^2 Y \quad (18)$$

$$Q_{j0}=V_j^2 Y \quad (19)$$

3. The equivalent reactive power flows on the line within the points A and B are calculated by:

$$Q^*_i = Q_i + Q_{i0} \quad (20)$$

$$Q^*_{ij} = Q_{ij} - Q_{j0} \quad (21)$$

4. The reactive loss on the line is estimated by:

$$\Delta Q_1 = \frac{X_{ij}(P_i^2 + (Q_i^*)^2)}{V_i^2} \quad (22)$$

$$\Delta Q_2 = \frac{X_{ij}(P_{ij}^2 + (Q_{ij}^*)^2)}{V_j^2} \quad (23)$$

$$\Delta Q = \frac{\Delta Q_1 + \Delta Q_2}{2} \quad (24)$$

The reactive loss is estimated from the two buses respectively and Equation (24) provides the average estimation from the two buses.

5. The parameter Y is updated using the measured reactive power flows at the two buses and the estimated line loss by:

$$Y(\text{new}) = \frac{Q_{ij} - Q_i + \Delta Q}{V_i^2 + V_j^2} \quad (25)$$

A threshold for filtering accuracy is specified. The threshold is based on the precision of PMU measurements, error transfer relationship between the measurements and Y, and possible small change of Y in the given short interval, which can be determined through testing and pre-estimation. For example, if 5% is used as the threshold, when Y(new) is larger than 1.05×Y(old) or smaller than 0.95×Y(old) wherein Y(old) refers to the value of Y in the last estimation, this whole set of measurements ($V_i$, $\theta_i$, $V_j$, $\theta_j$, $P_i$, $Q_i$, $P_{ij}$ and $Q_{ij}$) may be viewed as unreliable data and abandoned.

6. The equivalent charging reactive power at the receiving bus is updated by:

$$Q_{j0}(\text{new}) = V_j^2 Y(\text{new}) \quad (26)$$

7. The line reactive power on the line at the receiving end is updated by:

$$Q^*_{ij} = Q_{ij} - Q_{j0}(\text{new}) \quad (27)$$

8. The parameters $R_{ij}$ and $X_{ij}$ are estimated using Equations (2) and (3). Letting $$R_{ij}P_{ij} + X_{ij}Q^*_{ij} = -V_j^2 + V_i V_j \cos\theta_{ji} = a \quad (28)$$

$$R_{ij}Q^*_{ij} - X_{ij}P_{ij} = V_i V_j \sin\theta_{ji} = b \quad (29)$$

It can be derived from Equations (28) and (29) that:

$$R_{ij}(\text{new}) = \frac{aP_{ij} + bQ^*_{ij}}{P_{ij}^2 + (Q^*_{ij})^2} \quad (30)$$

$$X_{ij}(\text{new}) = \frac{aQ^*_{ij} - bP_{ij}}{P_{ij}^2 + (Q^*_{ij})^2} \quad (31)$$

Similarly, a threshold for filtering accuracy is specified. The threshold is based on the precision of PMU measurements, error transfer relationship between the measurements and $R_{ij}$ or $X_{ij}$, and possible small change of $R_{ij}$ or $X_{ij}$ in the given short interval, which can be determined through testing and pre-estimation. For example, if 5% is used as the threshold, when either $R_{ij}$(new) is larger than 1.05×$R_{ij}$(old) or smaller than 0.95×$R_{ij}$(old), or $X_{ij}$(new) is larger than 1.05× $X_{ij}$(old) or smaller than 0.95×$X_{ij}$(old), this whole set of measurements ($V_i$, $\theta_i$, $V_j$, $\theta_j$, $P_i$, $Q_i$, $P_{ij}$ and $Q_{ij}$) is viewed as unreliable data and may be abandoned.

If the number of reliable sets of measurements is smaller than a specified threshold (such as 10), more sampling data should be used until the specified threshold is met. If all sets of measurements for a line in the given interval are filtered out as invalid data, a warning message should be sent to operators. Consecutive warning messages indicate that the PMU devices for that particular line may be in an abnormal situation.

C. Estimating $R_{ij}$, $X_{ij}$ and Y

Each of the estimated parameters in the above process is based on individual sampling data at a time point, and is used for the purpose of filtering invalid data. The parameters should be re-estimated using a group of sampling data to minimize errors. It is assumed that M reliable sets of measurements are obtained after the filtering process.

The parameter Y is re-estimated using the average of the M estimated Y values obtained using the M reliable sets of measurements in the filtering process:

$$Y(estim) = \frac{\sum_{k=1}^{M} Y_k(new)}{M} \quad (32)$$

wherein $Y_k$(new) is the value obtained using Equation (25) corresponding to the kth reliable set of measurements after filtering.

The parameter $R_{ij}$ or $X_{ij}$ is also re-estimated using the average of the M estimated $R_{ij}$ or $X_{ij}$ values obtained using the M reliable sets of measurements in the filtering process:

$$R_{ij}(estim) = \frac{\sum_{k=1}^{M} R_{ijk}(new)}{M} \quad (33)$$

$$X_{ij}(estim) = \frac{\sum_{k=1}^{M} X_{ijk}(new)}{M} \quad (34)$$

wherein $R_{ijk}$(new) and $X_{ijk}$(new) are, respectively, the values obtained using Equations (30) and (31) corresponding to the kth reliable set of measurements after filtering.

The standard deviations of $R_{ij}$(estim) and $X_{ij}$(estim) are calculated using the following equations:

$$R_{ij}(sd) = \sqrt{\frac{\sum_{k=1}^{M} [R_{ijk}(new) - R_{ij}(estim)]^2}{M-1}} \quad (35)$$

$$X_{ij}(sd) = \sqrt{\frac{\sum_{k=1}^{M} [X_{ijk}(new) - X_{ij}(estim)]^2}{M-1}} \quad (36)$$

If either $R_{ij}$(sd)/$R_{ij}$(estim) or $X_{ij}$(sd)/$X_{ij}$(estim) is larger than a threshold (expressed as a %), the estimated $R_{ij}$ and $X_{ij}$ obtained using Equations (33) and (34) are abandoned and the parameters $R_{ij}$ and $X_{ij}$ are re-estimated using the following method. This threshold is generally selected as a half of the threshold for filtering accuracy (see step 8 above).

Equations (28) and (29) are re-written as:

$$R_{ij} + cX_{ij} = d \quad (37)$$

$$R_{ij} + eX_{ij} = f \quad (38)$$

wherein:

$$c = \frac{Q_{ij}^*}{P_{ij}} \quad (39)$$

$$d = \frac{-V_j^2 + V_i V_j \cos\theta_{ij}}{P_{ij}} \quad (40)$$

$$e = \frac{-P_{ij}}{Q_{ij}^*} \quad (41)$$

$$f = \frac{V_i V_j \sin\theta_{ij}}{Q_{ij}^*} \quad (42)$$

Applying the least square method to Equation (37) with the M sets of reliable measurements results in:

$$R_{ij1}(estim) = \bar{d} - \bar{c} X_{ij1}(estim) \quad (43)$$

$$X_{ij1}(estim) = \frac{S_{cd}}{S_{cc}} \quad (44)$$

wherein:

$$\bar{d} = \frac{\sum_{k=1}^{M} d_k}{M} \quad (45)$$

$$\bar{c} = \frac{\sum_{k=1}^{M} c_k}{M} \quad (46)$$

$$S_{cd} = \sum_{k=1}^{M} (c_k - \bar{c})(d_k - \bar{d}) \quad (47)$$

$$S_{cc} = \sum_{k=1}^{M} (c_k - \bar{c})^2 \quad (48)$$

Similarly, applying the least square method to Equation (38) with the M sets of reliable measurements results in:

$$R_{ij2}(estim) = \bar{f} - \bar{e} X_{ij2}(estim) \quad (49)$$

$$X_{ij2}(estim) = \frac{W_{ef}}{W_{ee}} \quad (50)$$

wherein:

$$\bar{f} = \frac{\sum_{k=1}^{M} f_k}{M} \quad (51)$$

$$\bar{e} = \frac{\sum_{k=1}^{M} e_k}{M} \quad (52)$$

$$W_{ef} = \sum_{k=1}^{M} (e_k - \bar{e})(f_k - \bar{f}) \quad (53)$$

$$W_{ee} = \sum_{k=1}^{M} (e_k - \bar{e})^2 \quad (54)$$

The subscript k indicates the value corresponding to the kth reliable set of measurements after filtering.

The $R_{ij}$ and $X_{ij}$ are estimated by:

$$R_{ij}(estim) = \frac{R_{ij1}(estim) + R_{ij2}(estim)}{2} \tag{55}$$

$$X_{ij}(estim) = \frac{X_{ij1}(estim) + X_{ij2}(estim)}{2} \tag{56}$$

In a high voltage transmission system, $R_{ij}$ is much smaller than $X_{ij}$, and $P_{ij}$ is generally much larger than $Q^*_{ij}$. It is possible that in numerical calculations, Equation (37) is more accurate than Equation (38) for estimation of $R_{ij}$ whereas that Equation (38) is more accurate than Equation (37) for estimation of $X_{ij}$. An alternative approach in an actual application is to use both Equations (37) and (38) first as described above. Then, if the difference between $R_{ij1}$(estim) and $R_{ij2}$(estim), or between $X_{ij1}$(estim) and $X_{ij2}$(estim), exceeds a threshold (in a relative percentage), only $R_{ij1}$(estim) and $X_{ij2}$(estim) are used as the final estimates.

The derivation above is based on the fact that three phases in a transmission system are symmetrical and therefore a single phase model is used in power flow calculation modeling. Similar to SCADA measurements, PMU devices provide separate measurements of phases A, B and C, which may have slight differences among them. The total real and reactive line power flows of the three phases can be obtained by summing up the line power flows that are calculated from measured voltage and current phasors of three individual phases. For voltage phasors, which are required in the calculations, the following two approaches can be used:
(1) The average of the measured voltage magnitudes or angles of phases A, B and C is used or the measured voltage magnitude and angle of one selected phase with the best measurement precision (for example, phase A) is used. This is the traditional method used in the exiting EMS.
(2) The voltage phasors of phases A, B and C and the total three phase power flows are used to estimate three sets of line parameters. The final parameter estimate is the average of the three estimates using the voltage phasors of phases A, B and C.

D. Calculating the Index ELSI

PMU measurements include time stamps. For each monitored line, reliable sets of measurements after invalid data filtering are used to calculate the index ELSI. The $R_{ij}$ and $X_{ij}$ may be estimated in a relatively long interval such as every 2-5 minutes whereas the ELSI may be calculated in a relatively short interval such as every 5 seconds in the normal state. If a contingency occurs during the 5 second interval, the ELSI is calculated right after the contingency. In the calculation of ELSI, the last estimated $R_{ij}$ and $X_{ij}$ are utilized. The calculation of ELSI can be completed within 0.1-0.5 seconds. As mentioned above, calculating the equivalent source voltage and impedance uses measurements of two system states. If the two states are so close that there is no effective difference in the measured voltage and power flow of the line between the two system states, the second state is skipped and the next system state is used until an effective difference is found. If there is no effective difference between the two system stats in the whole current interval, the last ELSI calculated in the last interval is used as the ELSI in the current interval. This is because if there is no effective change between the two states, system instability will not happen. Therefore, there may be only one or multiple ELSI index values in the given interval depending on differences between system states, and whether or not there is any outage event in the given interval.

E. Use of the Index ELSI

In normal states, there only exit relatively small disturbances (such gradual load and/or generation changes), however, it is still possible that cumulative changes may cause the system to gradually move towards a collapse point. The index ELSI is used to monitor the weak lines/buses and predict the distance of the system state from voltage instability in a real time manner.

For a contingency (outage of a major system component), there are two situations:
(1) The system does not lose voltage stability following a contingency. Most cases belong to this situation. In this situation, the index ELSI is calculated before and after the contingency. The index ELSI should show a decline but should still be larger than 1.0 after a contingency. The difference between the index value after the contingency and 1.0 provides the information about how close the system is to the collapse point allowing the operator can decide what measures need to be taken to avoid possible voltage instability.
(2) The system will lose voltage stability following a contingency. This is a rare situation. For this situation, there are two approaches to using the index ELSI.
   (a) Post-outage action. The index ELSI may be used to trigger a load/generation shedding remedial action scheme (RAS) for voltage instability. Generally, the process of a system losing voltage stability takes at least a few seconds or longer. This is partly because bus loads around the weakest lines/buses causing voltage instability decrease as the voltage drops, which slows down the speed of the system losing voltage stability. In such a case, the contingency triggers an immediate calculation of ELSI (between two regular calculation points in the given interval). The calculation time of the index ELSI after a contingency (0.1-0.5 seconds) is sufficiently fast to trigger a load/generation shedding RAS before the system collapses.
   (b) Pre-outage action. The application of the index ELSI may be combined with the study-mode (off-line) analysis. A threshold of the index ELSI for a contingency can be found in advance through the continuation power flow analysis in a study mode. When the real time value of the index ELSI approaches the threshold, the operator should make a decision: either take a risk by doing nothing but arming the RAS, or take a measure to reduce the power flow on the critical line with the ELSI near the threshold, or on the line whose outage will cause the critical line to exceed its maximum transfer capability.

F. Implementation Using Existing SCADA and EMS

If insufficient PMU devices are installed in the system, on-line identification of voltage collapse and weak lines/buses using the method according to the invention and ELSI index can be still implemented on the existing Energy Management System (EMS) at control centers. As the measurements from SCADA do not include angle data, and other data are not synchronized measurements, measurements from SCADA are not directly used. However, the information of on-line system states including bus voltages (magnitude and angle) and line power flows (real and reactive powers) is available through the state estimator which uses the SCADA measurements, and power flow calculations following the state estimation. The on-line power flows are calculated continuously every four minutes in most existing EMS systems. Neither the filtering process nor line parameter estimation is needed. Actually, the state estimation can play a role of SCADA data filtering but it cannot perform line parameter estimation, which requires synchronized measurements. Although the ELSI index obtained using the existing SCADA and EMS information is less accurate than that obtained using the PMU information, it can still provide on-line prediction of voltage instability and weak lines/buses.

Test Cases

The presented method and ELSI index were tested by using the system continuation power flow that is accepted by the industry as a reference method for voltage stability study. Voltages and line flows obtained from considerable power flow calculations were used as "measurements". The tests were conducted on the four IEEE test systems, a utility system in China and the utility system operated and planned by the British Columbia Transmission Corporation in Canada. More than 30 cases in total were considered with different conditions (such as stressing loads at some buses or all buses, stressing generations, considering or not considering generator limits, etc.). All test cases indicate that the ELSI index of at least one line or a couple of lines is near 1.0 (less 1.01) at the system collapse point (just before the power flow divergence) whereas the ELSI indices of all lines monitored are much larger than 1.0 in the normal system states when the system power flow is far away from divergence.

Two examples are provided herein to demonstrate the feasibility and effectiveness of the method and system according to the invention.

A. IEEE 30 Bus Test System

IEEE provides a IEEE 30 bus system. The data and original single-line diagram of this system is available at the web site http://www.ee.washington.edu/research/pstca/, which is hereby incorporated by reference. The system was stressed by increasing both real and reactive loads at Bus 30. Multiple system power flows are solved using the commercial power flow program.

The following observations were made from the results of the test:

At the beginning, the index ELSI of all lines was much larger than 1.0 (from 2.4 to 30.0)

At stressing, the ELSI indices of line 27-30 and line 29-30 gradually decreased and approached 1.0 at the collapse point (from 4.5134 to 1.0014 for line 27-30 and from 6.021 to 1.0024 for line 29-30).

The ELSI index of line 27-29 was secondly close to 1.0 at the collapse point (1.0555). The index ELSI of all other lines were still much larger than 1.0 at the collapse point (from 1.25 to 3.0). The ELSI of line 28-27 was the lowest of all other lines.

The weakest lines 27-30 and 29-30 and secondly weakest line 27-29 were accurately identified using their ELSI indices. The system lost voltage stability due to the two weakest lines when their ELSI indices were near 1.0.

The weakest bus 30, which is the receiving bus of the two weakest lines, was identified. At the collapse point, the voltages at bus 27, 29 and 30 were 0.846, 0.732 and 0.635 (in p.u.), respectively.

Table 1 below presents the results showing that the ELSI indices of four lines (bus 27-bus 29, bus 27-bus 30, bus 29-bus 30 and bus 28-bus 27) decreased as the load (in MW) at Bus 30 increased. The numbers in the column "Lambda" are multiples of increased loads with regard to the base load of 10.6 MW at the beginning.

TABLE 1

ELSI of four lines (decreasing as the load at Bus 30 increasing)

| Lambda | 27-29 | 27-30 | 29-30 | 28-27 |
|---|---|---|---|---|
| 1 | | | | |
| 1.188679 | 5.6677 | 4.5134 | 6.021 | 5.1542 |
| 1.377358 | 4.8271 | 3.8612 | 5.0478 | 4.7306 |
| 1.566038 | 4.1426 | 3.2724 | 4.0164 | 4.0474 |
| 1.754717 | 3.5834 | 2.8636 | 3.4696 | 3.6541 |
| 1.943396 | 3.2388 | 2.5657 | 3.0262 | 3.3692 |
| 2.132075 | 2.8903 | 2.3126 | 2.7005 | 3.141 |
| 2.320755 | 2.654 | 2.0876 | 2.335 | 2.8443 |
| 2.528302 | 2.3425 | 1.8862 | 2.0984 | 2.6495 |
| 2.698113 | 2.1705 | 1.7477 | 1.9256 | 2.4611 |
| 2.886792 | 2.0051 | 1.6205 | 1.7679 | 2.309 |
| 3.075472 | 1.8389 | 1.5013 | 1.6188 | 2.1722 |
| 3.264151 | 1.6996 | 1.3971 | 1.482 | 2.0328 |
| 3.45283 | 1.5873 | 1.3132 | 1.3803 | 1.9121 |
| 3.641509 | 1.4655 | 1.2301 | 1.2798 | 1.7943 |
| 3.830189 | 1.3421 | 1.1502 | 1.1842 | 1.6345 |
| 4.018868 | 1.2345 | 1.0833 | 1.1037 | 1.5096 |
| 4.066038 | 1.1775 | 1.0485 | 1.0626 | 1.4334 |
| 4.113208 | 1.1102 | 1.0201 | 1.0272 | 1.3356 |
| 4.122642 | 1.0954 | 1.0121 | 1.0159 | 1.3022 |
| 4.132075 | 1.0809 | 1.0083 | 1.0117 | 1.2951 |
| 4.141509 | 1.0762 | 1.0064 | 1.0089 | 1.2861 |
| 4.150943 | 1.0682 | 1.0038 | 1.0054 | 1.2748 |
| 4.160377 | 1.0555 | 1.0014 | 1.0024 | 1.2531 |

Figure 3:
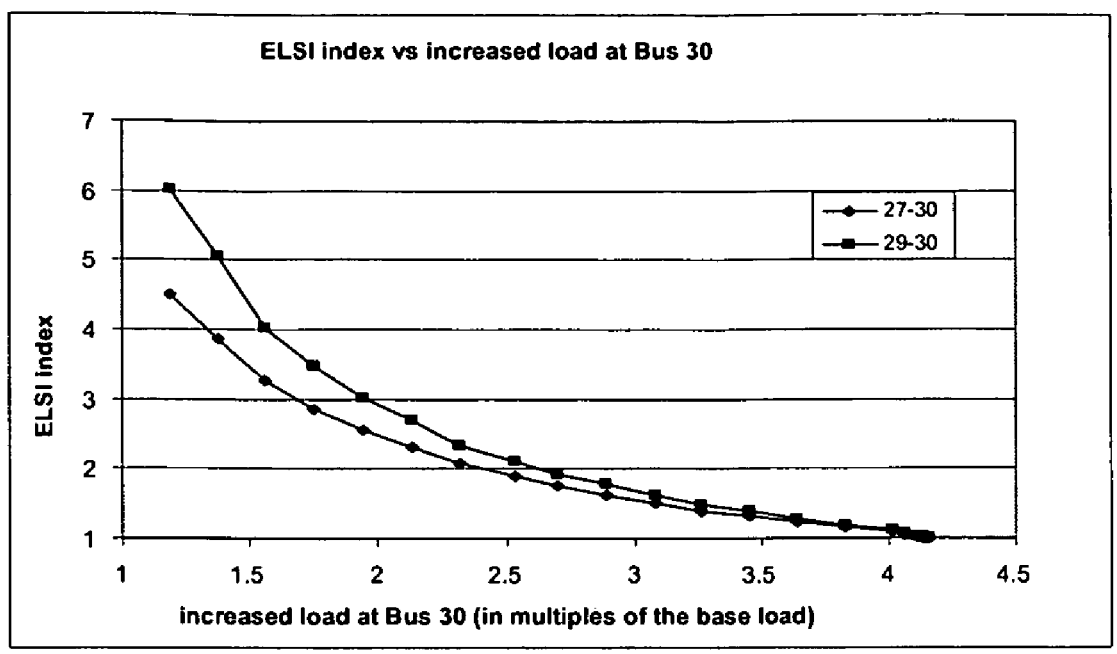
FIG. 3 is a chart showing the ELSI of the two weakest lines decreasing as the load at Bus 30 increases.
Figure 4:
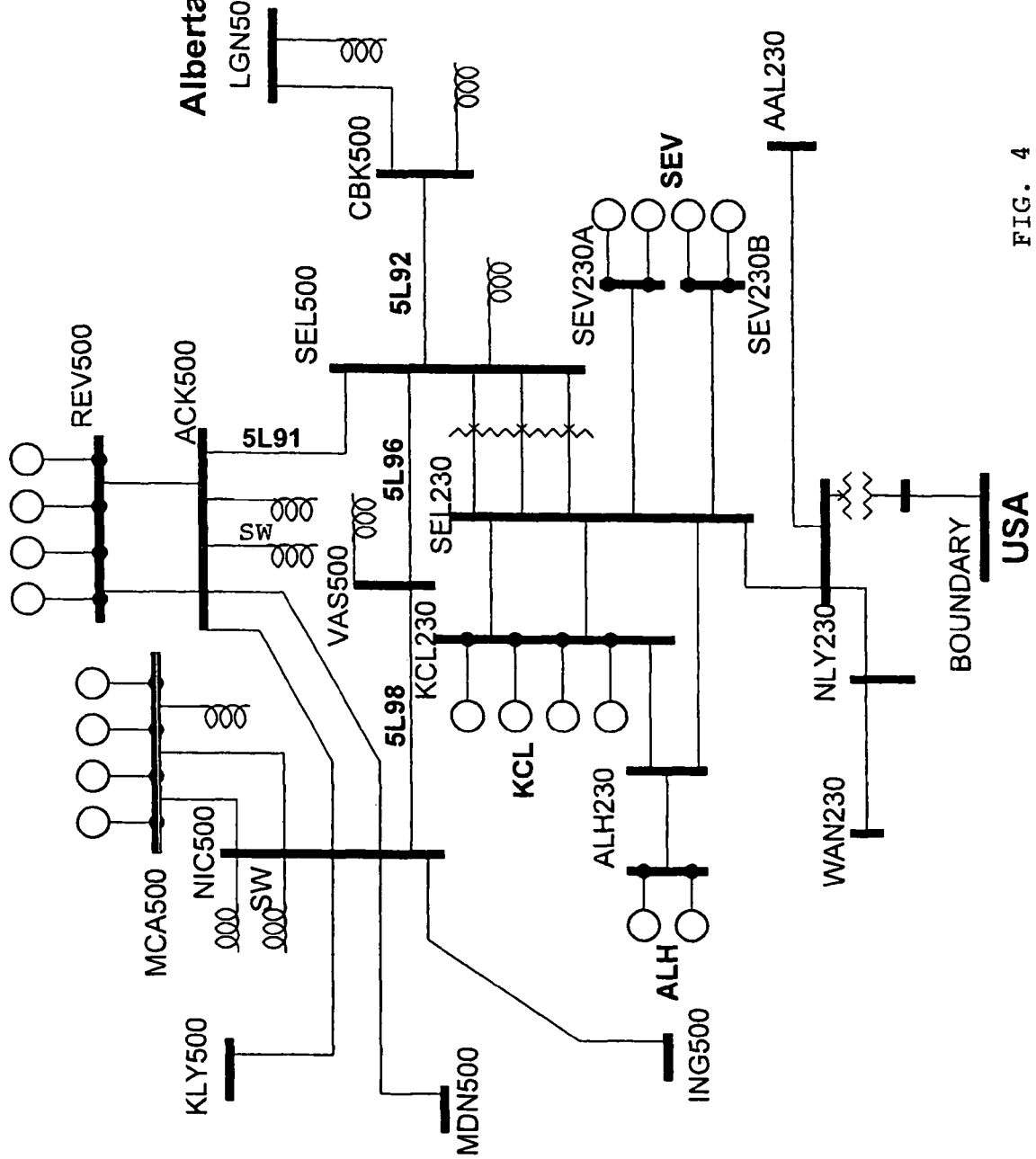
FIG. 4 is a representation of a portion of the British Columbia Transmission Corporation system.

FIG. 3 graphically shows how the ELSI indices of the two weakest lines (bus 27-bus 30 and bus 29-bus 30) varied with the increased load at Bus 30 (in multiples).

B. BCTC System

Figure 5:
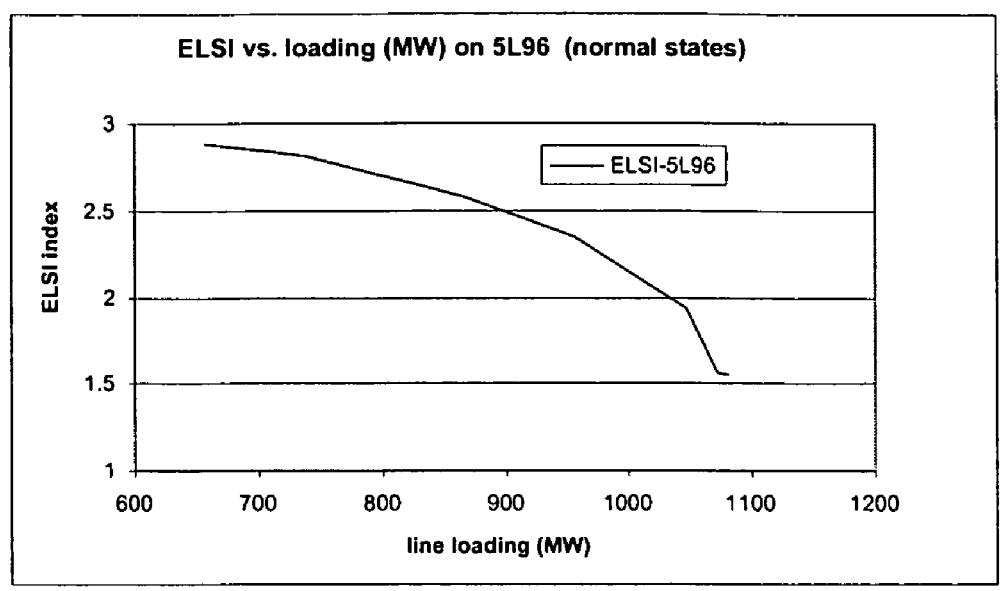
FIG. 5 is a chart showing the ELSI of line 5L96 of the British Columbia Transmission Corporation (BCTC) system in normal states (decreasing as its loading level is stressed)

The system power flow case used in testing had 15,161 buses and 19,403 branches, including the partial system model of the west USA network. FIG. 5 shows a partial representation of the system. General information and some particulars of the BCTC system are available at http://www.bctc.com/the_transmission_system, which is hereby incorporated by reference. Previous operation studies had shown that when line 5L91 is out-of-service or trips, lines 5L92, 5L96 and 5L98 have much higher loading levels. It was also known from such operation studies that when three local generator plants at KCL, ALH and SEV have high outputs, and if line 5L91 trips, then line 5L96 may exceed its transfer capability causing system collapse. This was an appropriate example for testing, as the results obtained from the method according to the invention and the ELSI index should have been consistent with what was known from operational experience. Commercial software was used to conduct system continuation power flow calculations in the following four test cases.

(1) In the normal system state with the line 5L91 in service, the generation at KCL, ALH and SEV generators was increased to stress the power flow on the line 5L96. In this case, line 5L96 should have sufficient transfer capability and the system should have no voltage instability problem.

(2) With the line 5L91 out-of-service, the generation at KCL, ALH and SEV generators was increased to stress the power flow on the lines 5L92, 5L96 and 5L98 until the system lost voltage stability.

(3) In the normal system state with line 5L91 in service, the generation at KCL, ALH and SEV generators was increased to stress power flows on the line 5L96. The line 5L91 trips at one point at which the system would be extremely close to voltage instability following such trip.

(4) Line 5L91 trips when line 5L96 has different loading levels in the normal state. The ELSI indices of 5L96 were examined before and after line 5L91 tripped.

It is noted that the operation conditions in the four cases have some differences. In Cases (1) and (2), the power flow to USA at the Nelway phase shifter is fixed at zero whereas in Cases (3) and (4), this exporting power flow is not fixed, so that part of increased generation will flow into the USA network, decreasing the loading pressure on lines 5L96, 5L98 and 5L92. This means that more generation outputs at the local generators are required to achieve the same loading level on the three lines. Also, there are more reactive power supports at reactive sources around 5L96 and 5L98 in Cases (3) and (4) than in Cases (1) and (2).

Case (1): Normal States, Stress Power Flow on 5L96

The results are shown in Table 2 and FIG. 5. It can be seen that as the power flow on line 5L96 is stressed, the ELSI index decreased. However, when the generation of all three local generator plants basically reached their maximum capacities, the ELSI was still much larger than 1.0, indicating that both 5L96 and the system have no voltage instability problem in the normal states.

TABLE 2

ELSI of line 5L96 in normal states (decreasing as local generations are increased)

| KCL gen | AHL gen | SEV gen | Pi(MW) | ELSI-5L96 |
|---|---|---|---|---|
| 143 | 90 | 200 | 657 | 2.87853 |
| 286 | 180 | 200 | 738 | 2.80791 |
| 429 | 180 | 200 | 865 | 2.57512 |
| 572 | 180 | 400 | 956 | 2.3481 |
| 572 | 180 | 600 | 1047 | 1.93662 |
| 572 | 180 | 670 | 1072 | 1.56245 |
| 572 | 180 | 695 | 1081 | 1.55095 |

Case (2): 5L91 Out-of-Service, Stress Power Flows on 5L96, 5L92 and 5L98

The power flows of eight system states were calculated. The ELSI indices of the lines 5L96, 5L92 and 5L98, whose loading levels had been stressed by the increased generation of the three local generator plants, were examined. Three of the eight power flows cases were filtered out for line 5L92 using the data filtering method (this was due to relatively large bus mismatches at the two buses of this line in power flow solutions), whereas all eight cases passed the filtering process for lines 5L96 and 5L98.

Figure 6:
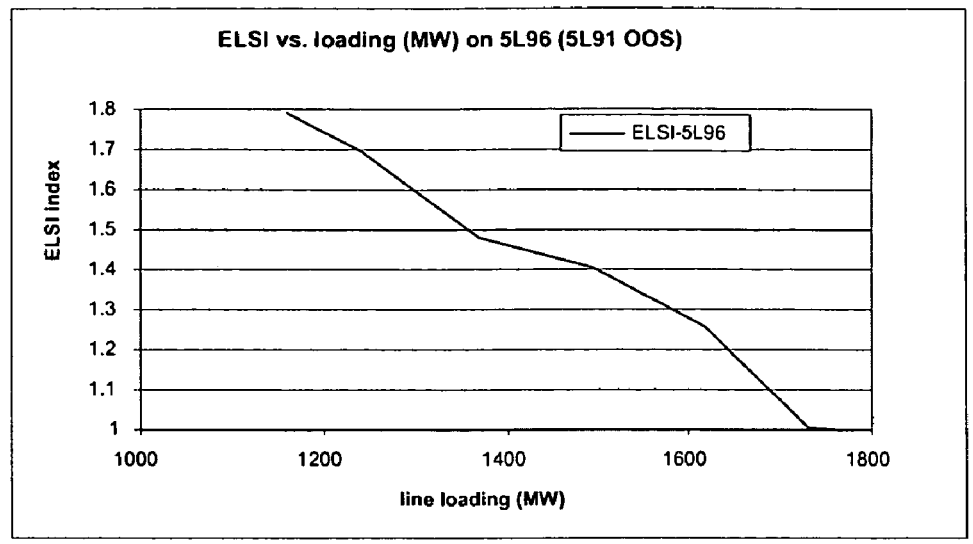
FIG. 6 is a chart showing the ELSI of line 5L96 while line 5L91 is out-of-service (decreasing as its loading level is stressed)
Figure 7:
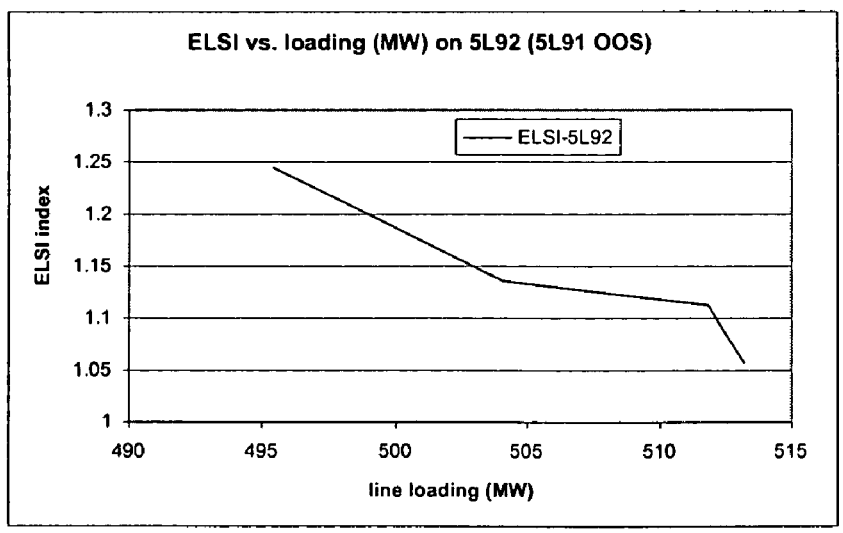
FIG. 7 is a chart showing the ELSI of line 5L92 while line 5L91 is out-of-service (decreasing as its loading level is stressed)
Figure 8:
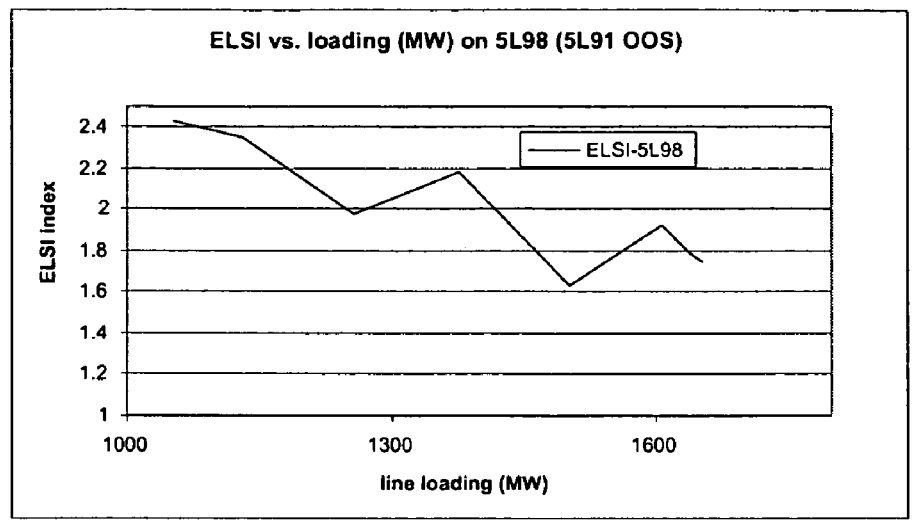
FIG. 8 is a chart showing the ELSI of line 5L98 while line 5L91 is out-of-service (decreasing as its loading level is stressed)

The results for the three lines 5L96, 5L92 and 5L98 are shown in Tables 3, 4 and 5, and FIGS. 6, 7, and 8 respectively. The ELSI indices of 5L96, 5L92 and 5L98 are 1.0018, 1.05719 and 1.74195 at the power flow divergence point. The ELSI indices indicate that 5L96 lost voltage stability, 5L92 was close to its voltage stability limit and 5L98 did not have any voltage instability problem. The system collapse was due to the fact that the power flow on line 5L96 exceeded its maximum transfer capability. This was identified by its ESLI index. The ELSI of 5L98 did not monotonically decrease as the loading level increased. This is because several reactive power sources around the receiving bus of 5L98 tried to support its voltage when the line flow was stressed. Also less local generation brought a higher loading level on line 5L96 when 5L91 was out-of-service compared to the normal system state in Case (1).

TABLE 3

ELSI of 5L96 while 5L91 out-of-service (decreasing as local generations were increased)

| KCL gen | ALH gen | SEV gen | Pi(MW) | ELSI-5L96 |
|---|---|---|---|---|
| 143 | 90 | 125 | 1161 | 1.79002 |
| 143 | 180 | 125 | 1240 | 1.69607 |
| 286 | 180 | 125 | 1368 | 1.48183 |
| 429 | 180 | 125 | 1493 | 1.40465 |
| 572 | 180 | 125 | 1617 | 1.2569 |
| 572 | 180 | 250 | 1730 | 1.00437 |
| 572 | 180 | 300 | 1763 | 1.00041 |
| 572 | 180 | 332 | 1781 | 1.0018 |
| 572 | 180 | 336 |  | diverge |

TABLE 4

ELSI of 5L92 while 5L91 out-of-service (decreasing as local generations were increased)

| KCL gen | ALH gen | SEV gen | Pi(MW) | ELSI-5L92 |
|---|---|---|---|---|
| 143 | 180 | 125 | 495.4 | 1.24553 |
| 429 | 180 | 125 | 504.1 | 1.13499 |
| 572 | 180 | 250 | 511.8 | 1.11286 |
| 572 | 180 | 300 | 512.4 | 1.08871 |
| 572 | 180 | 332 | 513.2 | 1.05719 |
| 572 | 180 | 336 |  |  |

TABLE 5

ELSI of 5L98 while 5L91 out-of-service (decreasing as local generations were increased)

| KCL gen | ALH gen | SEV gen | Pi(MW) | ELSI-5L98 |
|---|---|---|---|---|
| 143 | 90 | 125 | 1054 | 2.43069 |
| 143 | 180 | 125 | 1132 | 2.35008 |
| 286 | 180 | 125 | 1256 | 1.97799 |
| 429 | 180 | 125 | 1378 | 2.18041 |
| 572 | 180 | 125 | 1503 | 1.62796 |
| 572 | 180 | 250 | 1607 | 1.92112 |
| 572 | 180 | 300 | 1637 | 1.7964 |
| 572 | 180 | 332 | 1653 | 1.74195 |
| 572 | 180 | 336 |  |  |

Case (3): 5L91 Outage at the Critical Loading Level of 5L96 in Stressed Normal States By increasing the generation of the three local generator plants to stress 5L96, the loading level on 5L96 reached 1070 MW in a normal state. At this point, 5L91 tripped, resulting in the loading level on 5L96 to suddenly jump to 1879 MW. The ELSI dropped from 1.89693 (before the outage) to 1.00217 (after the outage). Although the system still critically survived right after the outage, a further stress by increasing only 8 MW on 5L96 (1887MW-1879MW) led to system collapse (power flow divergence). This indicated that system instability after line 5L91 outage is identified by the ELSI. More local generation outputs are required to make the loading level on line 5L96 reach its maximum capacity in this case than in Case (2) because part of increased generation outputs flows into the USA network through the tie line due to unfixed flow setting at the Nelway phase shifter. Also, the maximum transfer capability of line 5L96 at the collapse point in this case is slightly larger than that that in Case (2) because of more reactive power supports around line 5L96 in the initial operation condition. This is the similar situation in Case (4) following.

Figure 9:
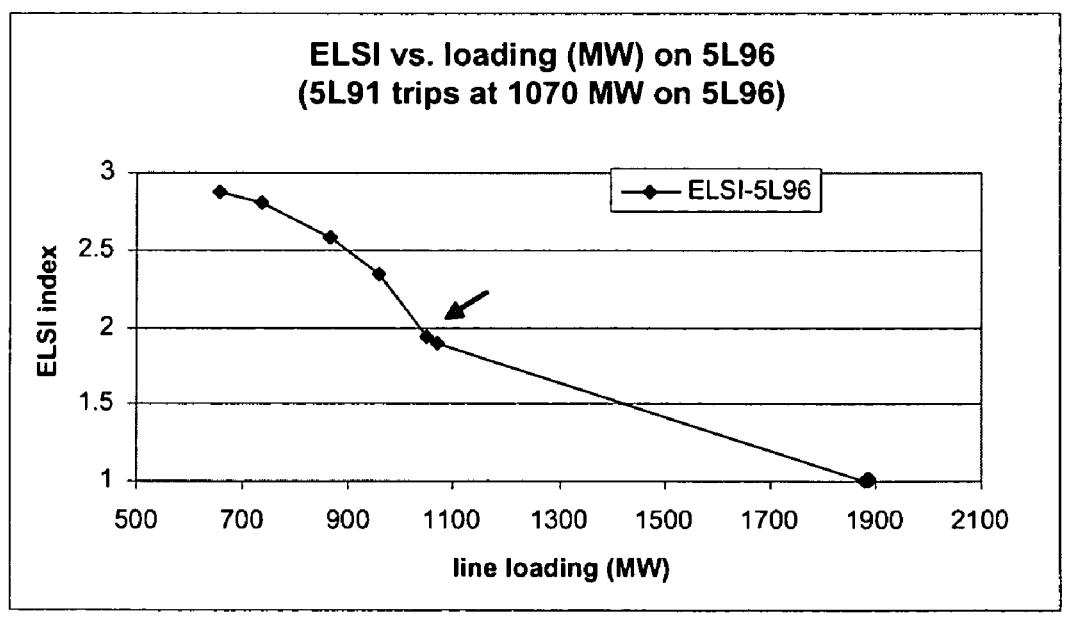
FIG. 9 is a chart showing the ELSI of line 5L96 (a sudden decline towards 1.0 after line 5L91 trips)

The results are shown in Table 6 and FIG. 9.

TABLE 6

ELSI of 5L96 (a big drop towards 1.0 after 5L91 trips)

| KCL gen | AHL gen | SEV gen | Pi | ELSI-5L96 | |
|---|---|---|---|---|---|
| 143 | 90 | 200 | 657 | 2.87853 | |
| 286 | 180 | 200 | 738 | 2.80791 | |
| 429 | 180 | 200 | 865 | 2.57512 | |
| 572 | 180 | 400 | 956 | 2.3481 | |
| 572 | 180 | 600 | 1047 | 1.93662 | |
| 572 | 180 | 665 | 1070 | 1.89693 | (5L91 trips at this point) |
| 572 | 180 | 665 | 1879 | 1.00217 | |
| 572 | 180 | 675 | 1883 | 1.01447 | |
| 572 | 180 | 685 | 1886 | 1.00657 | |
| 572 | 180 | 695 | 1887 | 1.01292 | |
| 572 | 180 | 700 | | diverge | |

Case (4): 5L91 outage at different loading levels of 5L96 in the normal states (a) Line 5L91 tripped when line 5L96 had a loading level around 950 MW in the normal state. After the outage, the loading level of line 5L96 jumped to 1689 MW. Correspondingly, the ELSI of line 5L96 dropped from 2.33912 to 1.15887. The system survived after the outage. The loading of line 5L96 can be still increased to 1746 MW after the outage while the ELSI decreases to 1.12773. In this case, no action should be taken before line 5L91 trips.

(b) Line 5L91 tripped when line 5L96 had a loading level of 1079 MW in the normal state. After the outage, the loading level of line 5L96 jumped to 1888 MW. Correspondingly, the ELSI of line 5L96 dropped from 21.70675 to 1.01167. The system reached a critical state after the outage. A small disturbance after the outage (increasing the generation at SEV by 5 MW from 690 MW to 695 MW) led to system collapse even if the loading on 5L96 no longer increased as the ELSI reached 1.00669. In this case, a pre-outage action of arming the generation shedding RAS should be taken before 5L91 trips.

Figure 10:
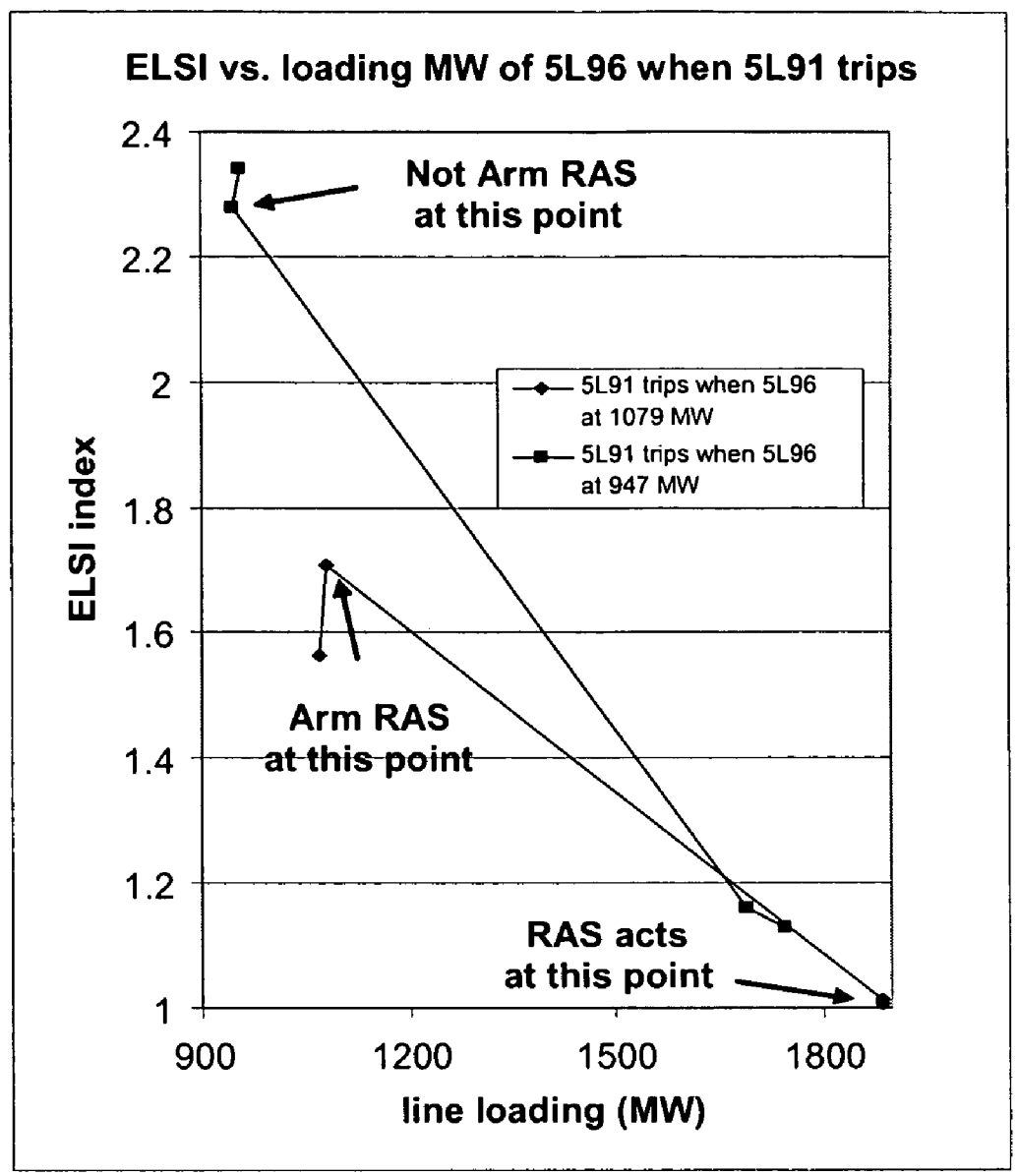
FIG. 10 is a chart showing the ELSI of line 5L96 when line 5L91 trips at two different loading levels of line 5L96.

The results are shown below in Table 7 and FIG. 10.

TABLE 7

ELSI of 5L96 when 5L91 tripping at two different loading levels of 5L96

| Pi (MW) | ELSI-5L96 | Pi (MW) | ELSI-5L96 | |
|---|---|---|---|---|
| 1072 | 1.56245 | 956 | 2.33912 | |
| 1079 | 1.70675 | 947 | 2.27698 | (5L91 trips at this point) |
| 1888 | 1.01167 | 1689 | 1.15887 | |
| 1887 | 1.00669 diverges | 1746 | 1.12773 survives | |

The calculations performed in the above described system and method can be implemented as a series of instructions stored on computer readable memory within a computer, such as within RAM, or on computer readable storage medium. The method and system may be expressed as a series of instructions present in a carrier wave embodying a computer data signal to communicate the instructions to a networked device or server, which when executed by a processor within the computer, carry out the method.

Although the particular preferred embodiments of the invention have been disclosed in detail for illustrative purposes, it will be recognized that variations or modifications of the disclosed apparatus lie within the scope of the present invention.

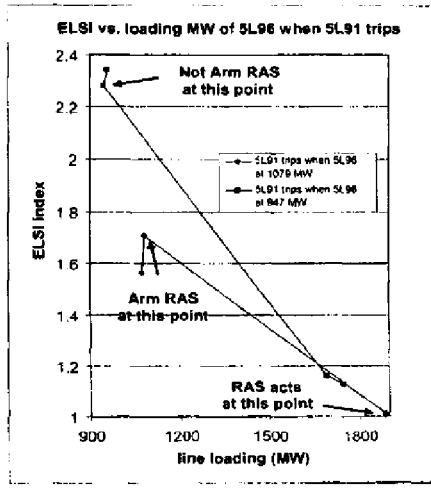

We claim:

1. A method of identifying a weakest monitored transmission line from a sending bus i to a receiving bus j within a power system having a plurality of transmission lines that is most likely to contribute to the power system collapse, comprising:

a) acquiring either:
(i) synchronized real-time measurements of voltage vectors and complex power flows at the sending bus i and receiving bus j for each of the monitored transmission lines from a phasor measurement unit (PMU) measuring system, said voltage vectors including real-time synchronized measurements of magnitudes ($V_i$, and $V_j$) and angles ($\theta_i$ and $\theta_j$), and said complex power flows including real-time synchronized measurements of real power ($P_i$ and $P_{ij}$) and reactive power ($Q_i$ and $Q_{ij}$); or
ii) estimates of voltage vectors and complex power flows at the sending bus i and receiving bus j of each of monitored transmission lines from a state estimator of an Energy Management System (EMS), said voltage vectors including estimated values of magnitudes ($V_i$ and $V_j$) and angles ($\theta_i$ and $\theta_j$) said complex power flows including estimated values of real power ($P_i$ and $P_{ij}$) and reactive power ($Q_i$ and $Q_{ij}$);

b) using said acquired measurements or estimates to calculate a basic line voltage stability index (BLSI) value of each of the monitored transmission lines using the equation:

$$BLSI = \frac{V_i^2}{2\left[R_{ij}P_{ij} + X_{ij}Q_{ij}^* + \sqrt{(R_{ij}^2 + X_{ij}^2)(P_{ij}^2 + (Q_{ij}^*)^2)}\right]} \geq 1$$

wherein $R_{ij}+jX_{ij}$ is a line impedance associated with the monitored transmission line; $P_{ij}+jQ^*_{ij}$ is a line complex power flow with a charging reactive power excluded at the receiving bus j of the monitored transmission line; and $V_i$ is a voltage at the sending bus i of the transmission line; and c) selecting the monitored transmission line which has a lowest BLSI value for identification of system voltage stability and if the lowest BLSI value is close to 1.0, the system is about to lose voltage stability.

2. The method of claim 1 wherein when said synchronized real-time measurements of voltage vectors and complex power flows are acquired, transmission line parameters, including resistance $R_{ij}$, reactance $X_{ij}$, and admittance Y, are calculated using said measurements at a current time; and if one of said line parameters calculated at said current time has a difference from the line parameter immediately previously calculated that exceeds a predetermined percentage threshold, all of said measurements corresponding to said current time are discarded.

3. The method of claim 2 wherein several sets of line parameters for each transmission line are calculated using undiscarded measurements in a given time interval; and a standard deviation of said several sets of transmission line parameters for each transmission line is calculated; and if the calculated standard deviation is smaller than a predetermined threshold, an average value of said several sets of line parameters for each transmission line is used in calculating said BLSI value; and if the calculated standard deviation is equal to or greater than said predetermined threshold, said transmission line parameters used in calculating said BLSI value are updated using a least squares method.

4. The method of claim 2 wherein said predetermined percentage threshold is 5%.

5. The method of claim 3 wherein said time interval to acquire measurements is 2-5 minutes, and at least 10 of said sets of undiscarded measurements are acquired.

6. The method of claim 1 wherein the BLSI value is calculated every 3-15 seconds.

7. The method of claim 1 wherein when the BLSI of the monitored transmission line which has a lowest BLSI value is less than 1.05, a remedial action is triggered to protect the system from voltage collapse.

8. The method of claim 1 wherein said measurements or estimates are received by a computer, and said BLSI value is calculated by said computer.

9. A method of identifying a weakest monitored transmission line from a sending bus i to a receiving bus j within a power system having a plurality of transmission lines that is most likely to contribute to the power system collapse, comprising:
   a) acquiring either:
      (i) synchronized real-time measurements of voltage vectors and complex power flows at the sending bus i and receiving bus j for each of the monitored transmission lines from a phasor measurement unit (PMU) measuring system, said voltage vectors including real-time synchronized measurements of magnitudes ($V_i$ and $V_j$) and angles ($\theta_i$ and $\theta_j$), and said complex power flows including real-time synchronized measurements of real power ($P_i$ and $P_{ij}$) and reactive power ($Q_i$ and $Q_{ij}$); or
      ii) estimates of voltage vectors and complex power flows at the sending bus i and receiving bus j of each of monitored transmission lines from a state estimator of an Energy Management System (EMS), said voltage vectors including estimated values of magnitudes ($V_i$ and $V_j$) and angles ($\theta_i$ and $\theta_j$), and said complex power flows including estimated values of real power ($P_i$ and $P_{ij}$) and reactive power ($Q_i$ and $Q_{ij}$);
   b) using said acquired measurements or estimates to calculate an extended line voltage stability index (ELSI) value of each of the monitored transmission lines i-j using the equation:

$$ELSI = \frac{E_k^2}{2\left[R_{kj}P_{ij} + X_{kj}Q_{ij}^* + \sqrt{(R_{kj}^2 + X_{kj}^2)(P_{ij}^2 + (Q_{ij}^*)^2)}\right]} \geq 1$$

wherein $R_{kj}+jX_{kj}$ is an equivalent line impedance of the transmission lines i-j in which an effect of an equivalent voltage source outside the buses i and j of transmission line i-j is incorporated; $P_{ij}+jQ^*_{ij}$ is a line complex power flow with the charging reactive power excluded at the receiving bus j; and $E_k$ is a voltage of an equivalent voltage source outside the buses i and j of transmission line i-j;
   c) selecting the monitored transmission line which has a lowest ELSI value for identification of system voltage stability and if the lowest ELSI value is close to 1.0, the system is about to lose voltage stability.

10. The method of claim 9 wherein when said synchronized real-time measurements of voltage vectors and complex power flows are acquired, transmission line parameters, including resistance $R_{ij}$, reactance $X_{ij}$, and admittance Y, are calculated using said measurements at a current time; and if one of said line parameters calculated at the current time has a difference from the line parameter immediately previously calculated that exceeds a predetermined percentage threshold, all of said measurements corresponding to said current time are discarded.

11. The method of claim 10 wherein several sets of line parameters for each transmission line are calculated using undiscarded measurements in a given time interval; and a standard deviation of said several sets of transmission line parameters for each transmission line is calculated; and if the calculated standard deviation is smaller than a predetermined threshold, an average value of said several sets of transmission line parameters for each transmission line is used in calculating said ELSI value; and if the calculated standard deviation is equal to or greater than said predetermined threshold, said transmission line parameters used in calculating said ELSI value are updated using a least squares method.

12. The method of claim 10 wherein said predetermined percentage threshold is 5%.

13. The method of claim 11 wherein said time interval to acquire said measurements is 2-5 minutes, and at least 10 of said sets of undiscarded measurements are acquired.

14. The method of claim 9 wherein the ELSI value is calculated every 3-15 seconds.

15. The method of claim 9 wherein when the ELSI of the monitored transmission line which has a lowest ELSI value is less than 1.05, a remedial action is triggered to protect the system from voltage collapse.

16. The method of claim 9 wherein said measurements or estimates are received by a computer, and said ELSI value is calculated by said computer.

17. A system for identifying a weakest monitored transmission line from a sending bus i to a receiving bus j within a power system, that is most likely to contribute to the power system collapse, comprising:
   a plurality of monitored transmission lines i-j;
   a computer;
   a plurality of phasor measurement units,
wherein said computer acquires either:
   (i) synchronized real-time measurements of voltage vectors and complex power flows at the sending bus i and receiving bus j for each of the monitored transmission lines from said phasor measurement units, said voltage vectors including real-time synchronized measurements of magnitudes ($V_i$ and $V_j$) and angles ($\theta_i$ and $\theta_j$), and said complex power flows including real-time synchronized measurements of real power ($P_i$ and $P_{ij}$) and reactive power ($Q_i$ and $Q_{ij}$); or
   ii) estimates of voltage vectors and complex power flows at the sending bus i and receiving bus j of each of the monitored transmission lines from a state estimator of an Energy Management System (EMS), said voltage vectors including estimated values of magnitudes ($V_i$ and $V_j$) and angles ($\theta_i$ and $\theta_j$), and said complex power flows including estimated values of real power ($P_i$ and $P_{ij}$) and reactive power ($Q_i$ and $Q_{ij}$);
and said acquired measurements or estimates are used to calculate a basic line voltage stability index (BLSI) value of each of the monitored transmission lines using the equation:

$$BLSI = \frac{V_i^2}{2\left[R_{ij}P_{ij} + X_{ij}Q_{ij}^* + \sqrt{(R_{ij}^2 + X_{ij}^2)(P_{ij}^2 + (Q_{ij}^*)^2)}\right]} \geq 1$$

wherein $R_{ij}+jX_{ij}$ is a line impedance associated with the monitored transmission line; $P_{ij}+jQ^*_{ij}$ is a line complex power flow with a charging reactive power excluded at the receiving bus j of the monitored transmission line; and $V_i$ is a voltage at the sending bus i of the transmission line and wherein the monitored transmission line which has a lowest BLSI value is used to determine system voltage stability and if the said lowest BLSI value is close to 1.0, the system is about to lose voltage stability.

18. A system for identifying a weakest monitored transmission line from a sending bus i to a receiving bus j within a power system, that is most likely to contribute to the power system collapse, comprising:
   a plurality of monitored transmission lines i-j;
   a computer;
   a plurality of phasor measurement units,
wherein said computer acquires either:
   (i) synchronized real-time measurements of voltage vectors and complex power flows at the sending bus i and receiving bus j for each of the monitored transmission lines from said phasor measurement units, said voltage vectors including real-time synchronized measurements of magnitudes ($V_i$ and $V_j$) and angles ($\theta_i$ and $\theta_j$), and said complex power flows including real-time synchronized measurements of real power ($P_i$ and $P_{ij}$) and reactive power ($Q_i$ and $Q_{ij}$); or
   ii) estimates of voltage vectors and complex power flows at the sending bus i and receiving bus j of each of the monitored transmission lines from a state estimator of an Energy Management System (EMS), said voltage vectors including estimated values of magnitudes ($V_i$ and $V_j$) and angles ($\theta_i$ and $\theta_j$), and said complex power flows including estimated values of real power ($P_i$ and $P_{ij}$) and reactive power ($Q_i$ and $Q_{ij}$);
and said acquired measurements or estimates are used to calculate an extended line voltage stability index (ELSI) value of each of the monitored transmission lines i-j using the equation:

$$ELSI = \frac{E_k^2}{2\left[R_{kj}P_{ij} + X_{kj}Q_{ij}^* + \sqrt{(R_{kj}^2 + X_{kj}^2)(P_{ij}^2 + (Q_{ij}^*)^2)}\right]} \geq 1$$

wherein $R_{kj}+jX_{kj}$ is an equivalent line impedance of the transmission lines i-j in which an effect of an equivalent voltage source outside the buses i and j of transmission line i-j is incorporated; $P_{ij}+jQ^*_{ij}$ is a line complex power flow with the charging reactive power excluded at the receiving bus j; and $E_k$ is a voltage of an equivalent voltage source outside the buses i and j of transmission line i-j;
and wherein the monitored transmission line which has a lowest ELSI value is used to determine system voltage stability and if the said lowest ELSI value is close to 1.0, the system is about to lose voltage stability.

* * * * *

UNITED STATES PATENT AND TRADEMARK OFFICE
CERTIFICATE OF CORRECTION

| | | |
|---|---|---|
| PATENT NO. | : 7,816,927 B2 | Page 1 of 2 |
| APPLICATION NO. | : 11/904153 | |
| DATED | : October 19, 2010 | |
| INVENTOR(S) | : Li et al. | |

It is certified that error appears in the above-identified patent and that said Letters Patent is hereby corrected as shown below:

The title page showing an illustrative figure should be deleted and substitute therefor the attached title page.

Signed and Sealed this
Sixth Day of December, 2011

David J. Kappos
*Director of the United States Patent and Trademark Office*

(12) United States Patent
Li et al.

(10) Patent No.: US 7,816,927 B2
(45) Date of Patent: Oct. 19, 2010

(54) METHOD AND SYSTEM FOR REAL TIME IDENTIFICATION OF VOLTAGE STABILITY VIA IDENTIFICATION OF WEAKEST LINES AND BUSES CONTRIBUTING TO POWER SYSTEM COLLAPSE

(75) Inventors: Wenyuan Li, Burnaby (CA); Juan Yu, Chongqing (CN); Yang Wang, Chongqing (CN); Paul Choudhury, Coquitlam (CA); Jun Sun, Burnaby (CA)

(73) Assignee: British Columbia Hydro and Power Authority, Vancouver (CA)

(*) Notice: Subject to any disclaimer, the term of this patent is extended or adjusted under 35 U.S.C. 154(b) by 300 days.

(21) Appl. No.: 11/904,153

(22) Filed: Sep. 25, 2007

(65) Prior Publication Data
US 2009/0027067 A1    Jan. 29, 2009

Related U.S. Application Data

(60) Provisional application No. 60/952,494, filed on Jul. 27, 2007.

(30) Foreign Application Priority Data
Sep. 19, 2007   (CA)   ................... 2602980

(51) Int. Cl.
   *G01R 27/28*   (2006.01)
   *G01R 25/00*   (2006.01)
(52) U.S. Cl. ........................... 324/650; 702/65
(58) Field of Classification Search ............ 324/650, 324/649, 600; 702/65, 64, 57, 1
See application file for complete search history.

(56) References Cited

U.S. PATENT DOCUMENTS

| | | | | |
|---|---|---|---|---|
| 4,455,612 | A * | 6/1984 | Girgis et al. | 700/294 |
| 4,584,523 | A * | 4/1986 | Elabd | 324/96 |
| 5,610,834 | A * | 3/1997 | Schlueter | 700/293 |
| 5,745,368 | A * | 4/1998 | Ejebe et al. | 702/164 |
| 6,713,998 | B2 | 3/2004 | Stanimirov et al. | |
| 6,904,372 | B2 * | 6/2005 | Fulczyk et al. | 702/58 |
| 6,933,714 | B2 | 8/2005 | Fasshauer et al. | |
| 7,096,175 | B2 * | 8/2006 | Rehtanz et al. | 703/18 |
| 7,117,070 | B2 * | 10/2006 | Chow et al. | 700/297 |
| 7,164,275 | B2 | 1/2007 | Gasperi | |

(Continued)

FOREIGN PATENT DOCUMENTS

JP    06113465 A  *  4/1994

OTHER PUBLICATIONS

Eastern Interconnection Phasor Project, IEEE, 2006, pp. 336-342.

(Continued)

*Primary Examiner* — Hoai-An D Nguyen
(74) *Attorney, Agent, or Firm* — Nixon Peabody LLP

(57) ABSTRACT

A method of identifying voltage instability in a power system via identification of a weakest line and bus that contribute to the collapse of the system is provided. The method includes periodically calculating an extended line stability index for the transmission lines monitored in the power system; and using the extended line stability index to determine the distance of an operation state in the power system from a collapse point of the system caused by voltage instability.

18 Claims, 8 Drawing Sheets